(12) United States Patent
Chen

(10) Patent No.: US 12,549,165 B2
(45) Date of Patent: Feb. 10, 2026

(54) PROTECTION CIRCUIT AND PROTECTION METHOD

(71) Applicant: RichWave Technology Corp., Taipei (TW)

(72) Inventor: Che-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 111 days.

(21) Appl. No.: 18/542,767

(22) Filed: Dec. 18, 2023

(65) Prior Publication Data

US 2025/0062756 A1 Feb. 20, 2025

(30) Foreign Application Priority Data

Aug. 16, 2023 (TW) ................................. 112130812

(51) Int. Cl.
*H03K 5/00* (2006.01)
*H03K 3/0233* (2006.01)
(Continued)

(52) U.S. Cl.
CPC .............. *H03K 5/08* (2013.01); *H03K 3/0233* (2013.01); *H03K 5/2472* (2013.01); *H03K 17/08122* (2013.01)

(58) Field of Classification Search
CPC ........ H03K 5/08; H03K 5/1532; G01R 19/04; G01R 19/16547; G01R 19/0053; G01R 19/16519; G01R 19/0038; H02H 9/02; H02H 9/04; H02H 9/041; H02H 3/20; H02H 3/24; H02H 3/207; H02H 3/027
See application file for complete search history.

(56) References Cited

U.S. PATENT DOCUMENTS 11,506,691 B2 * 11/2022 Kambara ............ G01R 19/0053
2010/0013450 A1 * 1/2010 Huang ................ H02M 3/33561
323/282
(Continued)

FOREIGN PATENT DOCUMENTS

CN 112072611 12/2020
TW 201427214 7/2014

OTHER PUBLICATIONS

"Office Action of Taiwan Counterpart Application", issued on Jul. 9, 2024, p. 1-p. 6.

*Primary Examiner* — Tuan T Lam
(74) *Attorney, Agent, or Firm* — JCIPRNET

(57) ABSTRACT

A protection circuit including a voltage dividing circuit, a first comparator, a first switch, a second comparator, and a delay and logic circuit is provided. The voltage dividing circuit generates a first divided voltage and a second divided voltage based on a power voltage. The first comparator is configured to compare a reference voltage and the first divided voltage to generate a first comparison result. The second comparator is configured to compare the reference voltage and the second divided voltage to generate a second comparison result. The delay and logic circuit receives the first comparison result and the second comparison result. Wherein, according to a plurality of different states of the first comparison result and the second comparison result, the first switch is turned on to conduct part of current of the power voltage to a reference voltage terminal, or the first switch changes from turn-on to turn-off.

20 Claims, 7 Drawing Sheets

(51) Int. Cl.
    *H03K 5/08*         (2006.01)
    *H03K 5/24*         (2006.01)
    *H03K 17/0812*     (2006.01)

(56) References Cited

U.S. PATENT DOCUMENTS

| | | | |
|---|---|---|---|
| 2010/0164391 A1* | 7/2010 | Bea | H02M 3/156 |
| | | | 323/285 |
| 2016/0233659 A1* | 8/2016 | Barnette | H02H 3/08 |
| 2018/0321727 A1 | 11/2018 | Gailhard | |
| 2019/0310677 A1* | 10/2019 | Terasaki | G01R 19/16519 |
| 2019/0391627 A1* | 12/2019 | Chavali | G06F 13/4282 |
| 2020/0326359 A1* | 10/2020 | Terasaki | G01R 19/16576 |

* cited by examiner

PROTECTION CIRCUIT AND PROTECTION METHOD

CROSS-REFERENCE TO RELATED APPLICATION

This application claims the priority benefit of Taiwan application serial no. 112130812, filed on Aug. 16, 2023. The entirety of the above-mentioned patent application is hereby incorporated by reference herein and made a part of this specification.

BACKGROUND

Technical Field

The disclosure relates to a protection circuit and a protection method, and particularly relates to a protection circuit and a protection method for implementing protection based on a resonance state of a power supply.

Description of Related Art

In a circuit, since parasitic components therein may form a serial resonant circuit in the circuit, in such a case, when rapid power plugging and unplugging occurs, a resonant state occurs. This resonant state may further cause circuit components at a back end of a power supply voltage to have the risk of being burned due to an excessive harmonic voltage.

In the prior art, a snubber circuit composed of capacitors and resistors is often used to eliminate a voltage waveform generated by resonance through proper adjustment, thereby reducing generation of spikes. However, in addition to additional external circuit components, such approach requires adjustment operations for different states of different circuits, which increases the complexity of implementation.

SUMMARY

The disclosure is directed to a protection circuit and a protection method, which are adapted to reduce a risk of damage to components in the circuit due to a resonance phenomenon of a power supply.

An embodiment of the disclosure provides a protection circuit including a voltage dividing circuit, a first comparator, a first switch, a second comparator and a delay and logic circuit. The voltage dividing circuit generates a first divided voltage and a second divided voltage based on a power voltage. The first comparator is coupled to the voltage dividing circuit, and configured to compare a reference voltage and the first divided voltage to generate a first comparison result. The first switch is coupled to the first comparator. The second comparator coupled to the voltage dividing circuit, and configured to compare the reference voltage and the second divided voltage to generate a second comparison result. The delay and logic circuit is coupled to the first comparator and the second comparator, and receives the first comparison result and the second comparison result. Wherein, when a first state or a second state occurs, the first switch is turned on to conduct part of current of the power voltage to a reference voltage terminal. When a third state or a fourth state occurs, the first switch changes from turn-on to turn-off. Wherein, the first state is: the first divided voltage is greater than the reference voltage; the second state is: the first divided voltage is less than or equal to the reference voltage, and the second divided voltage is greater than the reference voltage. The third state is: the first divided voltage is less than or equal to the reference voltage, and the second divided voltage is greater than the reference voltage and after a delay time counted by the delay and logic circuit. The fourth state is: the first divided voltage is less than or equal to the reference voltage, and the second divided voltage is less than or equal to the reference voltage.

The disclosure provides a protection method including: providing a reference voltage; generating a first divided voltage and a second divided voltage based on a power voltage; respectively comparing the reference voltage with the first divided voltage and the second divided voltage to respectively generate a first comparison result and a second comparison result; when a first state or a second state occurs, conducting part of current of the power voltage to a reference voltage terminal; when a third state or a fourth state occurs, stopping conducting part of current to the reference voltage terminal. The first state is: the first divided voltage is greater than the reference voltage; the second state is: the first divided voltage is less than or equal to the reference voltage, and the second divided voltage is greater than the reference voltage; the third state is: the first divided voltage is less than or equal to the reference voltage, and the second divided voltage is greater than the reference voltage and after a delay time counted by a delay and logic circuit; the fourth state is: the first divided voltage is less than or equal to the reference voltage, and the second divided voltage is less than or equal to the reference voltage.

Another embodiment of the disclosure provides a protection circuit including a voltage dividing circuit, a comparator, a switch, and a delay and logic circuit. The voltage dividing circuit generates a divided voltage based on a power voltage. The comparator is coupled to the voltage dividing circuit. The comparator is configured to compare the divided voltage with a first reference voltage and a second reference voltage to generate a comparison result, wherein the first reference voltage is greater than the second reference voltage. The switch is coupled to the comparator. The delay and logic circuit is coupled to the comparator to receive the comparison result. When a first state or a second state occurs, the switch is turned on to conduct part of current of the power voltage to a reference voltage terminal. When a third state or a fourth state occurs, the switch changes from turn-on to turn-off. The first state is: the divided voltage is greater than the first reference voltage; the second state is: the divided voltage is less than or equal to the first reference voltage, and the divided voltage is greater than the second reference voltage; the third state is: the divided voltage is less than or equal to the first reference voltage, and the divided voltage is greater than the second reference voltage, and after a delay time counted by the delay and logic circuit. The fourth state is: the divided voltage is less than or equal to the second reference voltage.

Based on the above description, the protection circuit and protection method of the disclosure perform voltage dividing on the power voltage, and turn on or off the switch coupled between the power voltage and the reference voltage terminal through automatic detection of a change state of the generated divided voltage. When the switch is turned on, a rising trend of the power voltage may be suppressed by discharging the current, thereby controlling a resonance state amplitude of the power voltage and reducing the risk of damage to components in the circuit. In addition, the protection circuit of the disclosure may be implemented in integration and integrated in a chip, thereby reducing the number of additional external circuit components, and reducing a device area. Furthermore, the protection circuit and the protection method of the disclosure facilitate setting and adjustment of a judging mechanism through a programmable operation mode, which avails applications in various power supply fields.

DESCRIPTION OF THE EMBODIMENTS

Figure 1:
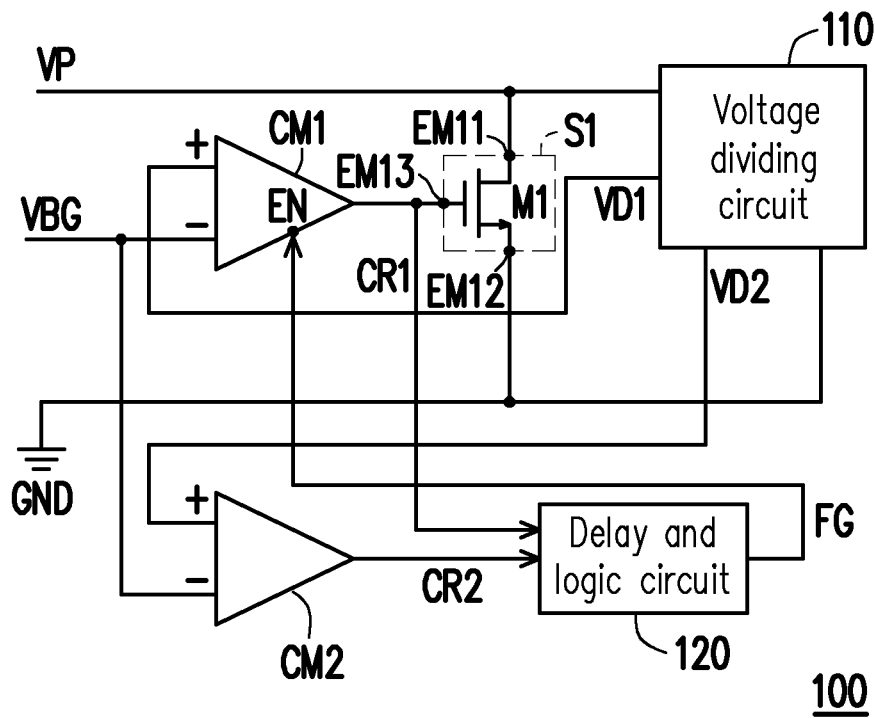
FIG. 1 is a schematic diagram of a protection circuit according to an embodiment of the disclosure.

Referring to FIG. 1, FIG. 1 is a schematic diagram of a protection circuit according to an embodiment of the disclosure. A protection circuit 100 includes a voltage dividing circuit 110, comparators CM1, CM2, a switch S1 and a delay and logic circuit 120. The voltage dividing circuit 110 receives a power voltage VP and is configured to divide the power voltage VP to generate a first divided voltage VD1 and a second divided voltage VD2. In the embodiment, the voltage dividing circuit 110 may divide the power voltage VP according to different voltage dividing ratios, and respectively generate the different first divided voltage VD1 and second divided voltage VD2. Where, the first divided voltage VD1 may be smaller than the second divided voltage VD2. In the embodiment, the power voltage VP is, for example, a direct current (DC) power voltage.

The comparator CM1 is coupled to the voltage dividing circuit 110. A negative input terminal of the comparator CM1 may receive a reference voltage VBG, and a positive input terminal of the comparator CM1 may receive the first divided voltage VD1 generated by the voltage dividing circuit 110. The comparator CM1 is configured to compare the reference voltage VBG with the first divided voltage VD1 to generate a first comparison result CR1. The comparator CM1 is further coupled to the switch S1 and the delay and logic circuit 120. The comparator CM1 may provide the generated first comparison result CR1 to a control terminal EM13 of the switch S1, and an enable terminal EN of the comparator CM1 may receive an indication signal FG from the delay and logic circuit 120. The comparator CM1 may be operated or stopped according to the indication signal FG.

The switch S1 is coupled between the power voltage VP and a reference voltage terminal GND (for example, a ground terminal). The switch S1 may be implemented by a transistor M1 and is a transistor switch. The transistor M1 may be any type of transistor, such as a field-effect transistor (FET), or a bipolar junction transistor (BJT), but the disclosure is not limited thereto. In the embodiment, the transistor M1 is, for example, a metal-oxide-semiconductor field-effect transistor (MOSFET). Further, the transistor M1 has a first terminal EM11, a second terminal EM12 and the aforementioned control terminal EM13, the first terminal EM11 receives the power voltage VP, the second terminal EM12 is coupled to the reference voltage terminal GND, and the control terminal EM13 is coupled to the comparator CM1 to receive the comparison result CR1, and the transistor M1 is turned on or off according to the comparison result CR1. Where, the first terminal EM11 is, for example, a drain terminal, the second terminal EM12 is, for example, a source terminal, and the control terminal EM13 is, for example, a gate terminal. When the transistor M1 is turned on, the transistor M1 may provide a current discharge path between the power voltage VP and the reference voltage terminal GND, and conduct part of current of the power voltage VP to the reference voltage terminal GND, thereby suppressing rise of the power voltage VP. When the transistor M1 is turned off, the above-mentioned current discharge path is cut off.

Another comparator CM2 is coupled to the voltage dividing circuit 110 and the delay and logic circuit 120. A negative input terminal of the comparator CM2 may receive the reference voltage VBG, and a positive input terminal of the comparator CM2 may receive the second divided voltage VD2 generated by the voltage dividing circuit 110. The comparator CM2 is configured to compare the reference voltage VBG with the second divided voltage VD2 to generate a second comparison result CR2.

On the other hand, the comparators CM1 and CM2 may transmit the respectively generated comparison results CR1 and CR2 to the delay and logic circuit 120. The delay and logic circuit 120 may start a timing action according to the comparison result CR1 and the comparison result CR2 to count a delay time. The delay and logic circuit 120 generates the indication signal FG according to the delay time and the comparison results CR1 and CR2, and provides the indication signal FG to the enable terminal EN of the comparator CM1.

Figure 2:
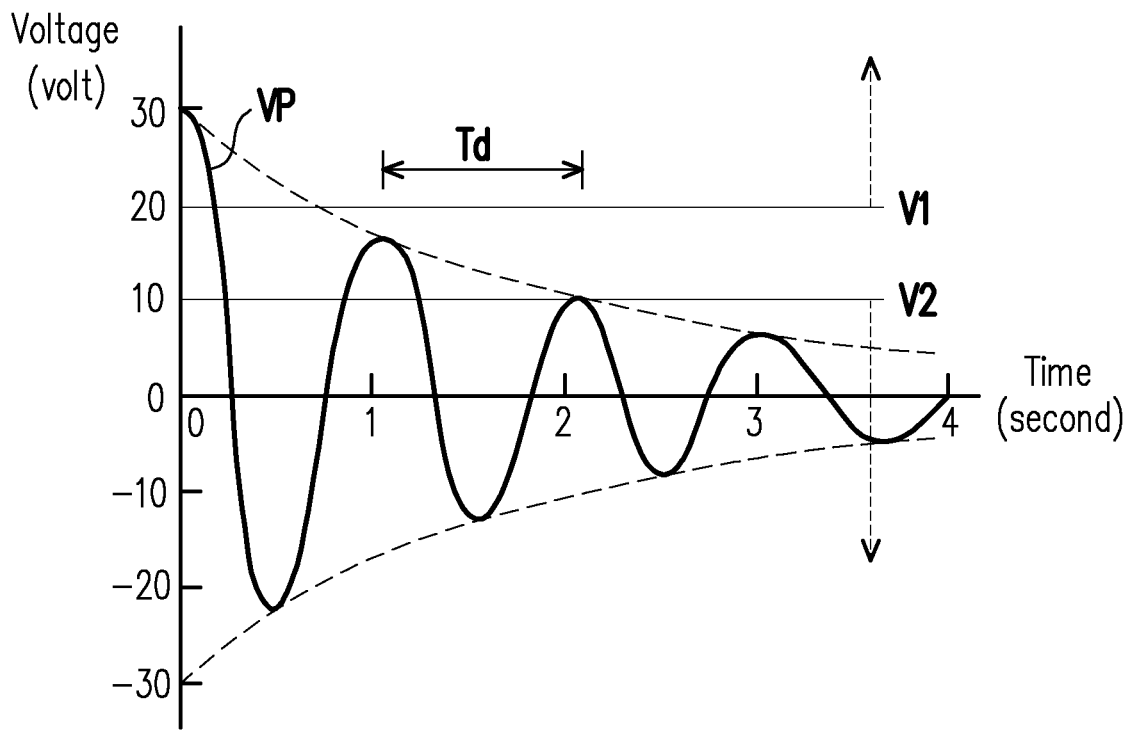
FIG. 2 is a schematic diagram illustrating an operation mode of the protection circuit according to the embodiment of the disclosure.

Referring to FIG. 2 below, FIG. 2 is a schematic diagram illustrating an operation mode of the protection circuit according to the embodiment of the disclosure. The protection circuit of the embodiment of the disclosure performs a protection operation by detecting a harmonic state of the power voltage VP. In a protection mechanism set by the protection circuit, the protection circuit may set thresholds V1 and V2 as detection references of the power voltage VP, where the threshold V1 is greater than the threshold V2. Where, when a peak value of the power voltage VP is greater than the threshold V1, the protection circuit may determine that the power voltage VP is in an over-high state. At this time, the protection circuit may turn on the switch S1 between the power voltage VP and the reference voltage terminal GND, and accordingly conduct part of current of the power voltage VP to the reference voltage terminal GND to suppress a rising trend of the power voltage VP, so as to reduce a risk of damage to components in the circuit due to the influence of excessive harmonics of the power voltage VP.

Thereafter, when the peak value of the power voltage VP is less than the threshold V1 and greater than the threshold V2, the protection circuit may determine that the power voltage VP has dropped, but is still in the over-high state. At this time, the protection circuit may continuously turn on the switch S1 between the power voltage VP and the reference voltage terminal GND, so that the power voltage VP may be continuously reduced.

Then, when the peak value of the power voltage VP is less than the threshold V2, (certainly less than the threshold V1), the protection circuit may determine that the power voltage VP is in a normal state. The protection circuit may cut off the switch S1 between the power voltage VP and the reference voltage terminal GND. Alternatively, in other embodiments, when it is detected that the peak value of the power voltage VP is less than the threshold V1 and greater than the threshold V2, the protection circuit may keep the switch S1 between the power voltage VP and the reference voltage terminal GND turning on for a delay time, and after the delay time, the protection circuit may cut off the switch S1 between the power voltage VP and the reference voltage terminal GND. The significance of setting the delay time is that based on a nature that a harmonic amplitude will decrease along with time, it may be predicted that when the peak value of the power voltage VP is less than the threshold V1 and greater than the threshold V2, as long as a period of time passes, the power voltage VP may be reduced to the normal state. Therefore, a timing of turning off the switch S1 between the power voltage VP and the reference voltage terminal GND may be determined by setting the above-mentioned delay time.

Referring to FIG. 1 and FIG. 2 synchronously below, in the embodiment of FIG. 1, the protection circuit 100 divides the power voltage VP and compares the first divided voltage VD1 and the second voltage VD2 with the reference voltage VBG to determine a magnitude relationship between the peak value of the power voltage VP and the thresholds V1 and V2. Where, when the peak value of the power voltage VP is greater than the threshold V1, the first divided voltage VD1 and the second divided voltage VD2 are both greater than the reference voltage VBG; when the peak value of the power voltage VP is less than or equal to the threshold V1 and greater than the threshold V2, the second divided voltage VD2 is greater than the reference voltage VBG, and the first divided voltage VD1 is less than or equal to the reference voltage VBG; and when the peak value of the power voltage VP is less than or equal to the threshold V2, the first divided voltage VD1 and the second divided voltage VD2 are both less than the reference voltage VBG.

According to the above description, the first, second, third, and fourth states defined by the relationship between the power voltage VP, the thresholds V1, V2, and the relationship between the first divided voltage VD1, the second divided voltage VD2, and the reference voltage VBG, and the comparison results CR1 and CR2 generated by the comparators CM1 and CM2 may be shown in a following table:

| State | | | CR1 | CR2 | Switch S1 |
|---|---|---|---|---|---|
| First state | VP > V1 | VD1 > VBG<br>VD2 > VBG | 1 | 1 | Turn on |
| Second third state | V1 >= VP > V2 | VD1 <= VBG<br>VD2 > VBG | 0 | 1 | Turn on/off |
| Fourth state | VP <= V2 | VD1 <= VBG<br>VD2 <= VBG | 0 | 0 | Turn off |

Referring to the above table, if the first divided voltage VD1 is greater than the reference voltage VBG, the comparison result CR1 is a logic value 1, and if the first divided voltage VD1 is not greater than the reference voltage VBG, the comparison result CR1 is a logic value 0. If the second divided voltage VD2 is greater than the reference voltage VBG, the comparison result CR2 is the logic value 1, and if the second divided voltage VD2 is not greater than the reference voltage VBG, the comparison result CR2 is the logic value 0.

It should be noted that in the above table, when it is detected that the first divided voltage VD1 is greater than the reference voltage VBG, it is the first state, and at this time the second divided voltage VD2 should also be greater than the reference voltage VBG. When it is detected that the first divided voltage VD1 is less than or equal to the reference voltage VBG, and the second divided voltage VD2 is greater than the reference voltage VBG, the protection circuit 100 may enter the second state. Moreover, in the second state, and after a delay time Td counted by the delay and logic circuit 120, based on the nature that the harmonic amplitude decreases along with time, it is determined that the protection circuit 100 may enter a third state. On the other hand, when the first divided voltage VD1 is less than or equal to the reference voltage VBG, and the second divided voltage VD2 is also less than or equal to the reference voltage VBG, the protection circuit 100 may enter a fourth state.

It should be noted that when the protection circuit 100 is in the first or second state, the comparator CM1 may turn on the switch S1 through the comparison result CR1.

By the way, in the third state and the fourth state, the delay and logic circuit 120 may correspondingly generate the indication signal FG, and may transmit the indication signal FG to the enable terminal EN of the comparator CM1 to stop the operation of the comparator CM1. Namely, when the protection circuit 100 is in the third or fourth state, the comparator CM1 may stop operating according to the indication signal FG, and stop providing the comparison result CR1 that may turn on the switch S1, so as to turn off the switch S1. By stopping the operation of the comparator CM1, power consumption of the protection circuit 100 may be reduced to meet an energy saving and carbon reduction requirement.

To further illustrate, in order to ensure that the power voltage VP stably enters the normal state, the above-mentioned delay time may be set by engineers according to an actual operating state of the circuit without specific limitation.

In the embodiment, the delay and logic circuit 120 may have a delay time counter and a logic circuit. The delay time counter is configured to count the aforementioned delay time Td, and the logic circuit is configured to generate the indication signal FG according to the comparison results CR1 and CR2. Where, a truth table used may, for example, refer to a following table:

| Input logic value | | | Output logic value |
|---|---|---|---|
| VD1 > VBG<br>A | VD2 > VBG<br>B | Td end<br>C | Switch S1 turn on<br>D |
| 1 | 1 | X | 1 |
| 0 | 1 | 0 | 1 |
| 0 | 1 | 1 | 0 |
| 0 | 0 | X | 0 |

With reference to the above table, the input logic value A is based on judgement of whether the first divided voltage VD1 is greater than the reference voltage VBG, and the input logic value B is based on judgement of whether the second divided voltage VD2 is greater than the reference voltage VBG. Namely, the input value logic A and the input logic value B may be determined according to the comparison results CR1, CR2. The input logic value C is based on judgement of whether the delay time Td has expired under the situation that the input logic value A is 0 (the first divided voltage VD1 is less than or equal to the reference voltage VBG) and the input logic value B is 1 (the second divided voltage VD2 is greater than the reference voltage VBG). The output logic value D is to correspondingly output an indication of whether to turn on the switch S1, which is equivalent to the indication signal FG. For example, when the input logic value A is 0 and the input logic value B is 1, if the delay time Td is not over, the input logic value C is 0, and the output logic value D is 1 at this time, which means that the instruction provided by the delay and logic circuit 120 is to keep the switch S1 in the turn-on state; and when the input logic value A is 0 and the input logic value B is 1, if the delay time Td has expired, the input logic value C is 1, and the output logic value D is 0 at this time, which means that the instruction provided by the delay and logic circuit 120 is to keep the switch S1 in the turn-off state.

In the embodiment, a duration of the delay time Td may be determined based on a resonant waveform generated by the power voltage VP. On the other hand, in a circuit structure, there is a relationship Q=CV=IT, where Q is a charge amount Q, C is a capacitance value, V is a voltage of a reference point, I is a current amount of ae charging current, and T is a duration of the delay time Td. Furthermore, the corresponding resonant waveform may be changed by adjusting the above parameters C, V, I, and then the duration of the delay time Td may be calculated according to the parameters C, V, I. In addition, in other embodiments, considering the nature that the harmonic amplitude will decrease along with time, it is also possible to determine a timing of turning off the switch S1 between the power voltage VP and the reference voltage terminal GND by calculating whether a number of times that the peak value of the resonant waveform exceeds the set threshold reaches a predetermined number of times.

By the way, the comparators CM1 and CM2 of the embodiment may be implemented by using any comparison circuit well known to those skilled in the art without any particular limitation.

Figure 3:
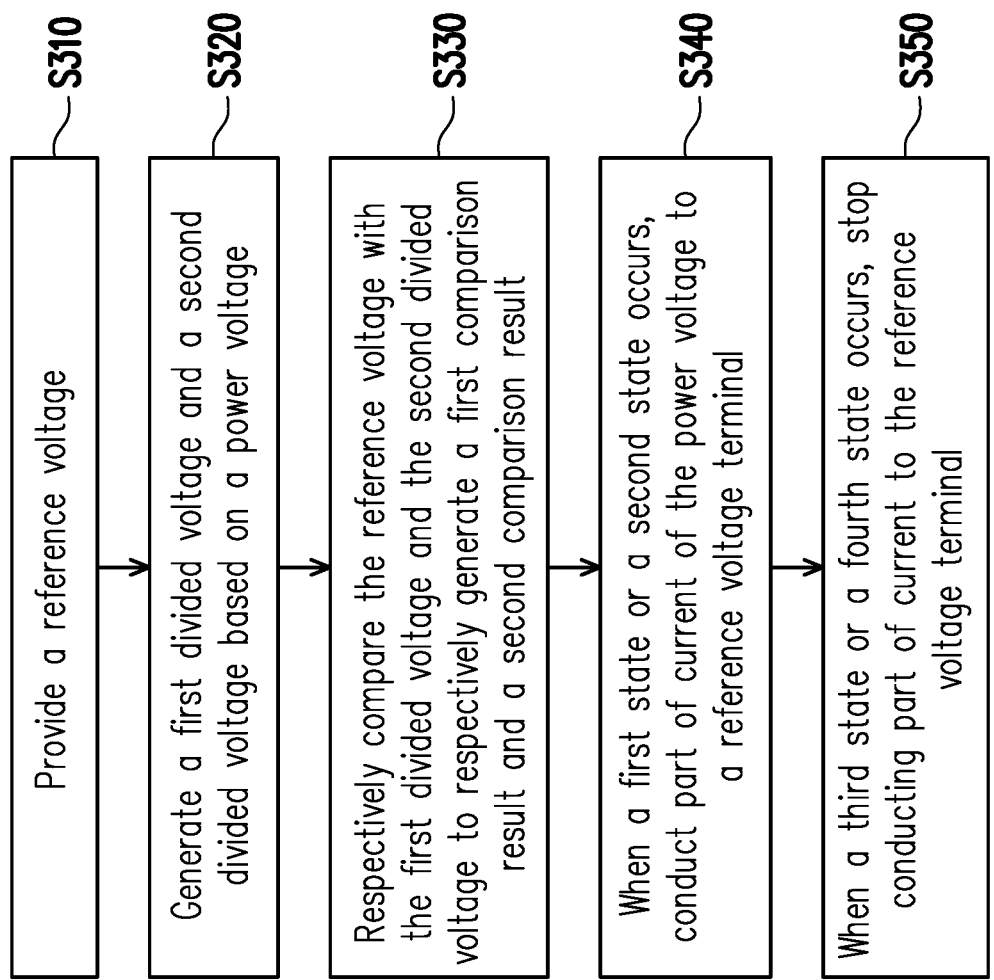
FIG. 3 is a flowchart of a protection method according to an embodiment of the disclosure.

Referring to FIG. 3 below, FIG. 3 is a flowchart of a protection method according to an embodiment of the disclosure. The protection method of the embodiment is used to provide a protection function to components in the circuit to reduce a risk of damage to the components in the circuit. In step S310, a reference voltage is provided. In step S320, a first divided voltage and a second divided voltage are generated based on a power voltage. In step S330, the reference voltage is respectively compared with the first divided voltage and the second divided voltage to respectively generate a first comparison result and a second comparison result. In step S340, when a first state or a second state occurs, part of current of the power voltage is conducted to a reference voltage terminal to reduce the risk of damage to the components in the circuit due to the influence of excessive harmonics of the power voltage; in step S350, when a third state or a fourth state occurs, part of current is stopped to be conducted to the reference voltage terminal. Where, the first state is: the first divided voltage is greater than the reference voltage; the second state is: the first divided voltage is less than or equal to the reference voltage, and the second divided voltage is greater than the reference voltage; the third state is: the first divided voltage is less than or equal to the reference voltage, and the second divided voltage is greater than the reference voltage and after a delay time counted by a delay and logic circuit; the fourth state is: the first divided voltage is less than or equal to the reference voltage, and the second divided voltage is less than or equal to the reference voltage.

Figure 4:
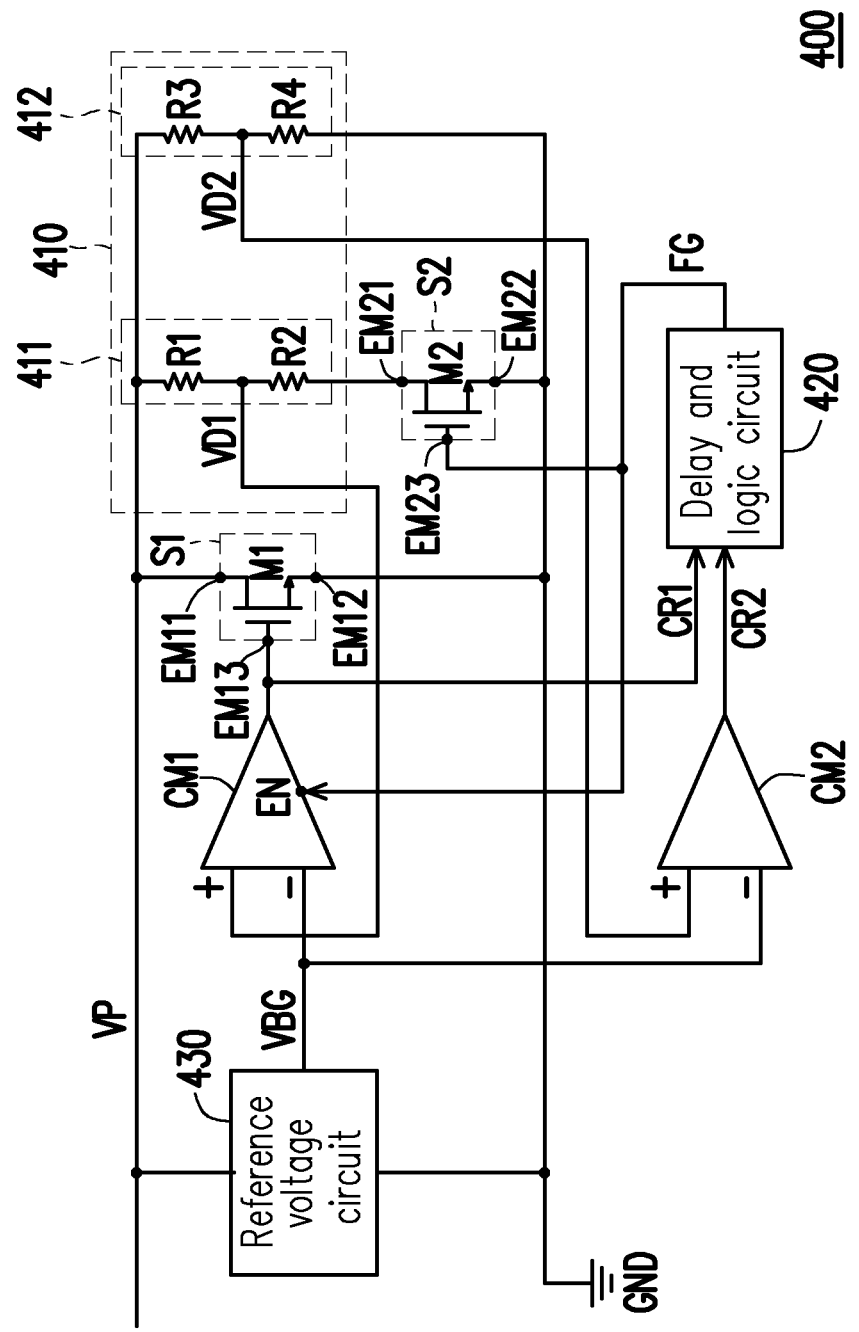
FIG. 4 is a schematic diagram of a protection circuit according to another embodiment of the disclosure.

Referring to FIG. 4, FIG. 4 is a schematic diagram of a protection circuit according to another embodiment of the disclosure. The protection circuit 400 includes a voltage dividing circuit 410, comparators CM1, CM2, switches S1, S2, a delay and logic circuit 420 and a reference voltage circuit 430. In the embodiment, the voltage dividing circuit 410 includes sub-voltage dividing circuits 411 and 412. The sub-voltage dividing circuit 411 includes a resistor string composed of resistors R1 and R2, and the sub-voltage dividing circuit 411 is coupled between the power voltage VP and the switch S2. The sub-voltage dividing circuit 412 includes a resistor string composed of resistors R3 and R4, and the sub-voltage dividing circuit 412 is coupled between the power voltage VP and the reference voltage terminal GND.

In addition, the switch S2 is coupled between the sub-voltage dividing circuit 411 and the reference voltage terminal GND. The switch S2 is implemented by a transistor M2, and the transistor M2 may be any type of transistor, such as a field-effect transistor (FET) or a bipolar junction transistor (BJT), but the disclosure is not limited thereto. In the embodiment, the transistor M2 is, for example, a metal-oxide-semiconductor field-effect transistor (MOSFET). Furthermore, the transistor M2 has a first terminal EM21, a second terminal EM22 and a control terminal EM23, the first terminal EM21 is coupled to the last serially connected resistor of the sub-voltage dividing circuit 411, and in the embodiment, the first terminal EM21 is, for example, coupled to the resistor R2, the second terminal EM22 is coupled to the reference voltage terminal GND, and the control terminal EM23 is coupled to the delay and logic circuit 420 and receives the indication signal FG generated by the delay and logic circuit 420, and the transistor M2 is turned on or turned off according to the indication signal FG. Where, the first terminal EM21 is, for example, a drain terminal, the second terminal EM22 is, for example, a source terminal, and the control terminal EM23 is, for example, a gate terminal.

In the embodiment, the reference voltage VBG is provided by the reference voltage circuit 430. The reference voltage circuit 430 generates the reference voltage VBG according to the power voltage VP. Where, the reference voltage circuit 430 may be a band gap voltage generating circuit.

Operation details of the protection circuit 400 of the embodiment are substantially the same as those of the protection circuit 100 of the embodiment of FIG. 1, which will not be repeated here. The differences between the embodiment of FIG. 4 and the embodiment of FIG. 1 are as follows, in the embodiment of FIG. 4, in the third state or the fourth state, the delay and logic circuit 420 may correspondingly generate the indication signal FG to stop the operation of the comparator CM1, so as to turn off the switch S2. By turning off the switch S2, a DC path of the sub-voltage dividing circuit 411 may be cut off, and unnecessary current consumption may be further reduced.

Figure 5:
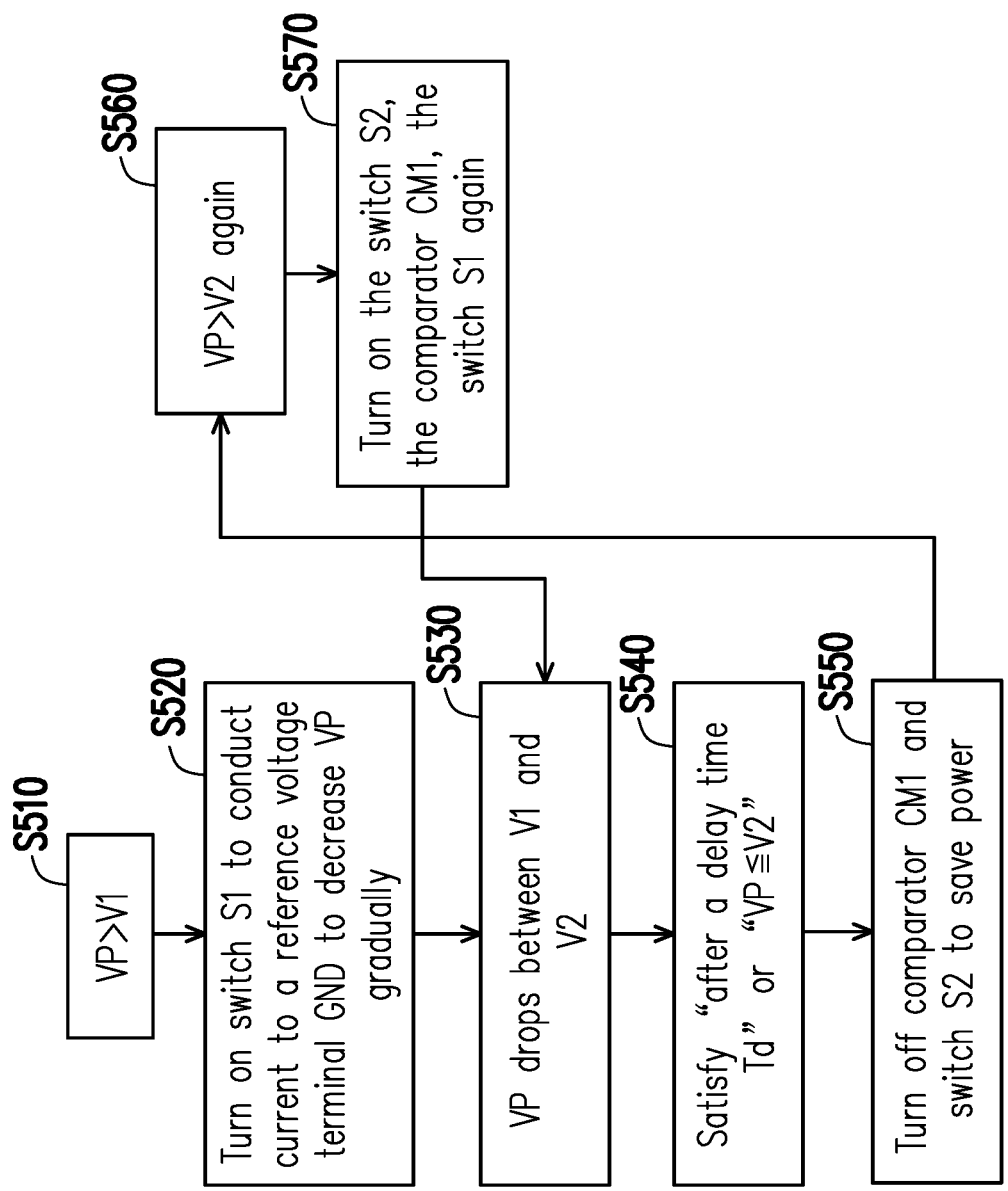
FIG. 5 is an operation flowchart of the embodiment of FIG. 4.

Further, referring to FIG. 4 and FIG. 5 synchronously below, where FIG. 5 is an operation flowchart of the embodiment of FIG. 4. In step S510, when the comparators CM1 and CM2 detect that both of the first divided voltage VD1 and the second divided voltage VD2 are greater than the reference voltage VBG, it represents that the peak value of the power voltage VP is greater than the threshold V1 (referring to FIG. 2). At this time, in step S520, the switch S1 may be turned on according to the comparison result CR1 generated by the comparator CM1. And through the turned-on switch S1, part of current of the power voltage VP is conducted to the reference voltage terminal GND (for example, the ground terminal), so that the power voltage VP gradually decreases. Then, in step S530, the peak value of the power voltage VP may be gradually dropped to be between the thresholds V1 and V2 (referring to FIG. 2). In step S540, after a delay time Td after the peak value of the power voltage VP falls between the thresholds V1 and V2, or when the power voltage VP is less than or equal to the threshold V2, the switch S1 may be turned off, and through execution of step S550, the delay and logic circuit 420 generates the indication signal FG to turn off the comparator CM1 and cut off the switch S2 to save power.

Harmonics based on the power voltage VP may occur repeatedly. In step S560, when the protection circuit 400 detects that the power voltage VP is greater than the threshold V2 again, the protection circuit 400 may execute step S570 to again turn on the switch S2 and the comparator CM1, and the comparator CM1 accordingly turns on the switch S1 again. And step S530 is re-executed to detect whether the power voltage VP is between the thresholds V1 and V2.

It should be noted that in the embodiment of the disclosure, after the switch S1 is turned off, the comparator CM2 may continue to operate and detect whether the second divided voltage VD2 is greater than the reference voltage VBG. Once the second divided voltage VD2 is again greater than the reference voltage VBG, it represents that the power voltage VP is again greater than the threshold V2. The delay and logic circuit 420 may also execute step S570 according to the comparison result CR2 to reawaken the switch S2 and the comparator CM1. And the comparator CM1 turns on the switch S1 again through the comparison result CR1 to suppress rising of the harmonic of the power voltage VP.

Figure 6:
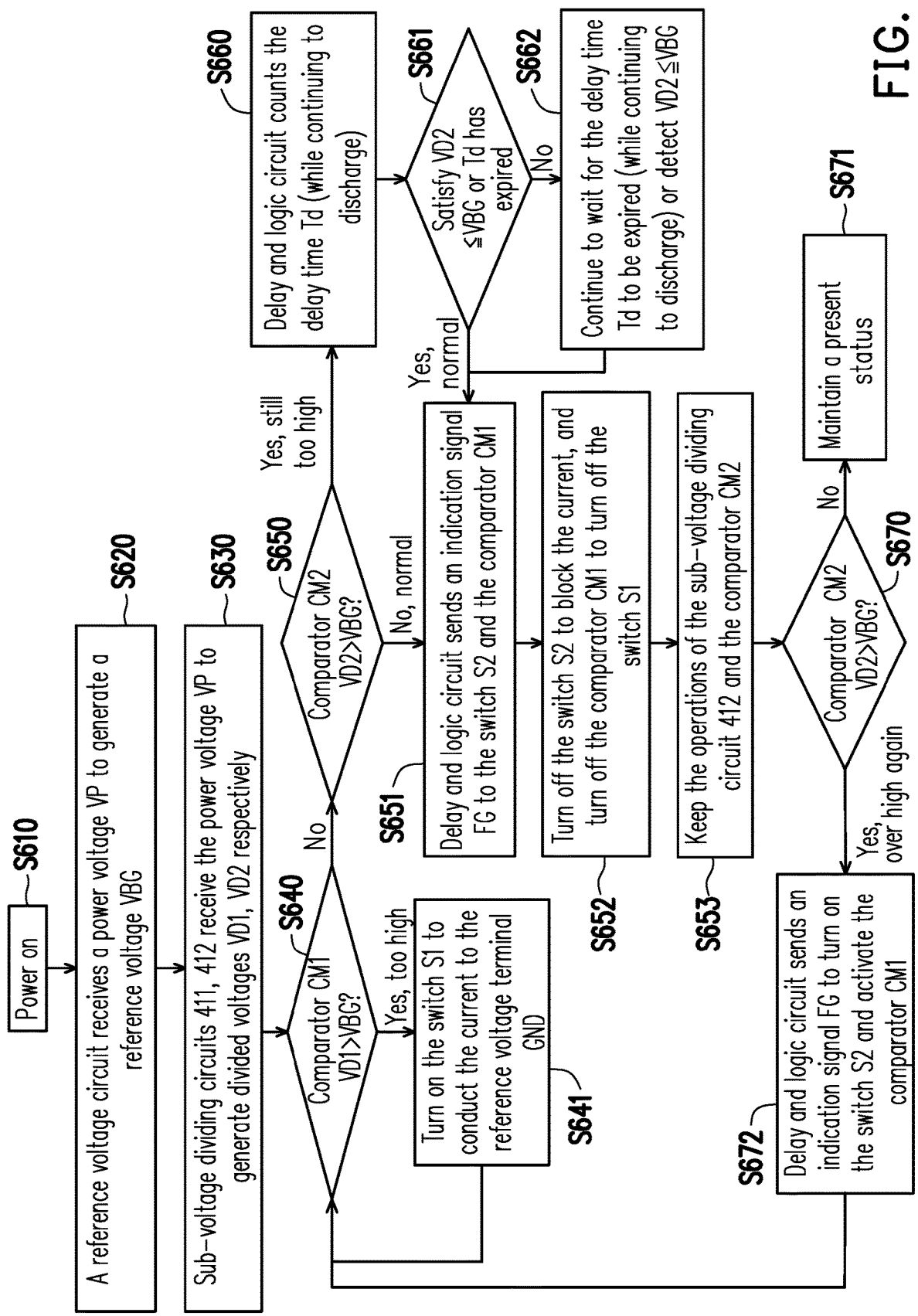
FIG. 6 is a flowchart of a protection method according to another embodiment of the disclosure.

Referring to FIG. 4 and FIG. 6 synchronously, where FIG. 6 is a flowchart of a protection method according to another embodiment of the disclosure, and the operation method is adapted to the protection circuit 400 of the embodiment shown in FIG. 4. In step S610, the circuit is powered on. Then, in step S620, the reference voltage circuit 430 in the protection circuit 400 receives the power voltage VP, and generates the reference voltage VBG according to the power voltage VP. In step S630, the sub-voltage dividing circuits 411 and 412 receive the power voltage VP and divide the power voltage VP to generate the first divided voltage VD1 and the second divided voltage VD2. Moreover, in step S640, the comparator CM1 may compare the first divided voltage VD1 with the reference voltage VBG, and when the first divided voltage VD1 is greater than the reference voltage VBG, step S641 is executed; and when the first divided voltage VD1 is not greater than the reference voltage VBG, step S650 is executed.

In step S640, when the comparator CM1 determines that the first divided voltage VD1 is greater than the reference voltage VBG, it represents that the harmonic of the power voltage VP is too high, and step S641 is executed. In step S641, the switch S1 may be turned on according to the comparison result CR1 of the comparator CM1 to conduct part of current of the power voltage VP to the reference voltage terminal GND (for example, the ground terminal), so as to reduce the risk of damage to components in the circuit due to the influence of excessive harmonics of the power voltage.

In step S650, the comparator CM2 compares the second divided voltage VD2 with the reference voltage VBG. When the second divided voltage VD2 is greater than the reference voltage VBG, it represents that the harmonic of the power voltage VP is still too high, and step S660 may be executed. In contrast, if the second divided voltage VD2 is not greater than the reference voltage VBG, it represents that the power voltage VP is in the normal state, and step S651 may be executed.

In step S660, the delay and logic circuit 420 performs a timing operation of the delay time Td. At the same time, a discharge operation of the power voltage VP through the switch S1 (referring to the above-mentioned conducting part of current of the power voltage VP to the reference voltage terminal GND) continues. Then, in step S661, after it is determined that a condition that the second divided voltage VD2 is less than or equal to the reference voltage VBG is satisfied, or a condition that the delay time Td has expired is satisfied, step S651 may be executed. On the contrary, if neither of the above two conditions is satisfied, step S662 is executed.

In step S662, continue to wait for satisfying of the condition that the second divided voltage VD2 is less than or equal to the reference voltage VBG, or wait for satisfying of the condition that the delay time Td is expired, and after one of the conditions is satisfied, step S651 is executed.

In step S651, the delay and logic circuit 420 sends the indication signal FG to the switch S2 and the comparator CM1, and in step S652, the switch S2 is turned off, and the comparator CM1 is turned off. In step S653, the operations of the sub-voltage dividing circuit 412 and the comparator CM2 are kept.

In step S670, when the comparator CM2 determines that the situation that the second divided voltage VD2 is greater than the reference voltage VBG occurs again, step S672 may be executed. IF the comparator CM2 determines that the situation that the second divided voltage VD2 is greater than the reference voltage VBG does not occur again, the present status is maintained (step S671).

In step S672, the delay and logic circuit 420 sends the indication signal FG to the switch S2 and the comparator CM1, so that the switch S2 is turned on and the comparator CM1 is reactivated, and then step S640 may be re-executed to continue the subsequent step process.

Figure 7:
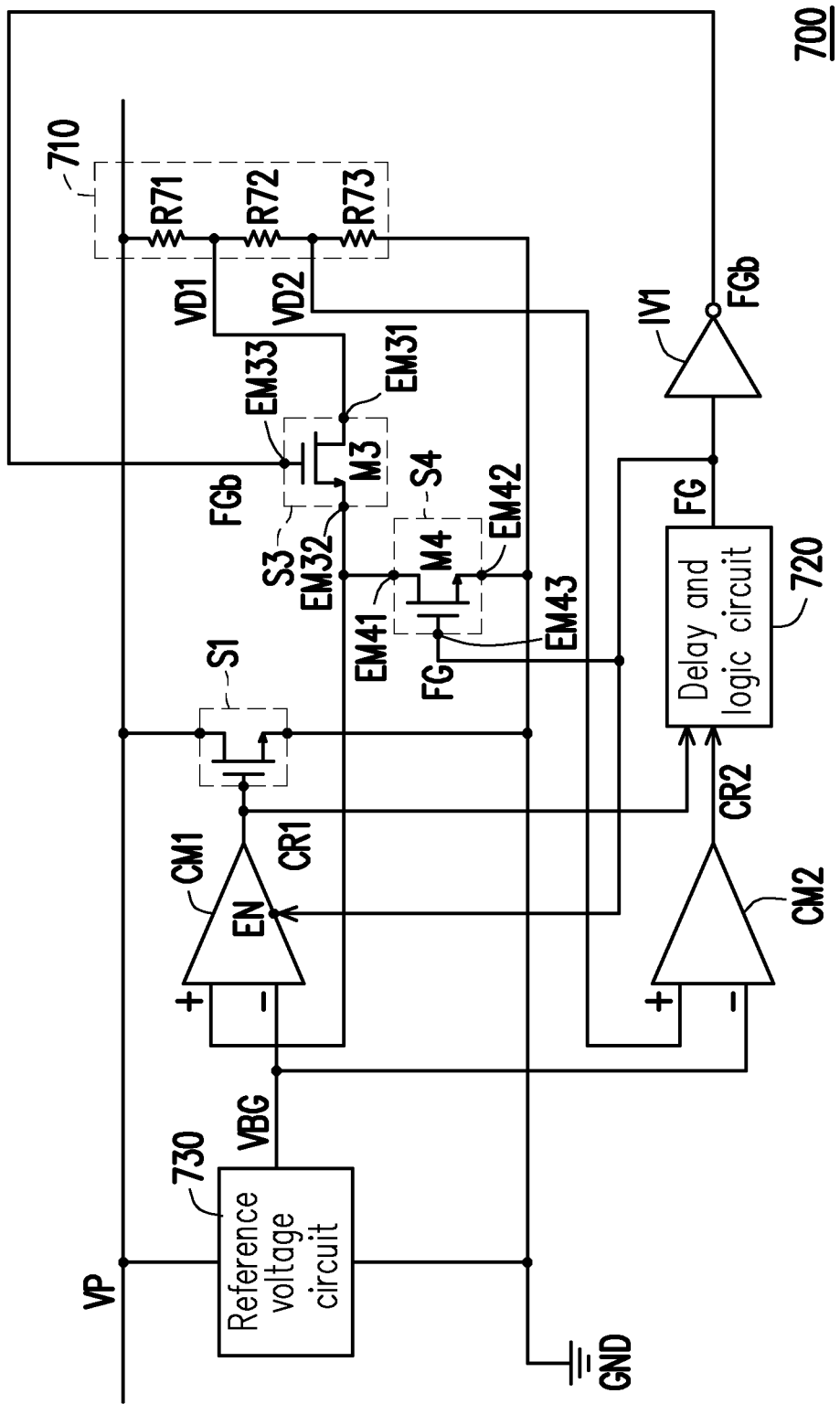
FIG. 7 is a schematic diagram of a protection circuit according to another embodiment of the disclosure.

Referring to FIG. 7 below, FIG. 7 is a schematic diagram of a protection circuit according to another embodiment of the disclosure. A protection circuit 700 includes a voltage dividing circuit 710, a delay and logic circuit 720, a reference voltage circuit 730, comparators CM1, CM2, switches S1, S3 and S4, and an inverter IV1. In the embodiment, the reference voltage circuit 730 generates the reference voltage VBG based on the power voltage VP. The voltage dividing circuit 710 divides the power voltage VP to generate a first divided voltage VD1 and a second divided voltage VD2, where the first divided voltage VD1 is greater than the second divided voltage VD2. The voltage dividing circuit 710 is composed of resistors R71-R73 sequentially connected in series, where the first divided voltage VD1 is generated at a node between the resistors R71 and R72, and the second divided voltage VD2 is generated at a node between the resistors R72 and R73.

Negative input terminals of the comparators CM1 and CM2 jointly receive the reference voltage VBG. Positive input terminals of the comparators CM1 and CM2 respectively receive the first divided voltage VD1 and the second divided voltage VD2. The comparators CM1 and CM2 respectively generate comparison results CR1 and CR2, where the comparison result CR1 is provided to the control terminal of the switch S1 and an input terminal of the delay and logic circuit 720, and the comparison result CR2 is provided to another input terminal of the delay and logic circuit 720.

An output terminal of the delay and logic circuit 720 generates an indication signal FG. The inverter IV1 is coupled to the output terminal of the delay and logic circuit 720 to receive the indication signal FG and generate an inverted indication signal FGb.

The operation mode of the protection circuit 700 of the embodiment is substantially similar to the operation modes of the protection circuits 100 and 400 described above, so that details thereof will not be repeated here. Different from the aforementioned embodiments, the protection circuit 700 further has switches S3 and S4. The switch S3 is coupled between the voltage dividing circuit 710 and the positive input terminal of the comparator CM1, and the switch S4 is coupled between the reference voltage terminal GND and the positive input terminal of the comparator CM1. The switches S3 and S4 are implemented by transistors M3 and M4, respectively. The transistors M3 and M4 may be transistors of any form, such as field-effect transistors (FET) or bipolar junction transistors (BJT), but the disclosure is not limited thereto. In the embodiment, the transistors M3 and M4 are, for example, metal-oxide-semiconductor field-effect transistors (MOSFET). The transistor M3 has a first terminal EM31, a second terminal EM32 and a control terminal EM33. The first terminal EM31 is coupled to the node between the resistors R71 and R72 of the voltage divider circuit 710 to receive the first divided voltage VD1, the second terminal EM22 is coupled to the positive input terminal of the comparator CM1 to provide the first divided voltage VD1 to the comparator CM1, and the control terminal EM33 receives the inverted indication signal FGb. The transistor M4 has a first terminal EM41, a second terminal EM42 and a control terminal EM43. The first terminal EM41 is coupled between the transistor M3 and the comparator CM1, the second terminal EM22 is coupled to the reference voltage terminal GND, and the control terminal EM33 receives the indication signal FG. Where, the first terminals EM31 and EM41 are, for example, drain terminals, the second terminals EM32 and EM42 are, for example, source terminals, and the control terminals EM33 and EM43 are, for example, gate terminals. The switches S3 and S4 are respectively controlled by the indication signal FG and the inverted indication signal FGb. Where, when the comparator CM1 operates normally according to the indication signal FG, the switch S3 is turned on and the switch S4 is turned off. At this time, the voltage dividing circuit 710 may normally output the first divided voltage VD1 to the positive input terminal of the comparator CM1, and the operation setting of the switch S4 being turned off at this time is to prevent the first divided voltage VD1 from being conducted to the reference voltage terminal GND. Comparatively, when the comparator CM1 stops operating according to the indication signal FG, the switch S3 is turned off and the switch S4 is turned on. At this time, the positive input terminal of the comparator CM1 receives a voltage (for example, the ground voltage) on the reference voltage terminal GND due to the switch S4 being turned on, so that the switch S1 may be automatically turned off.

Figure 8:
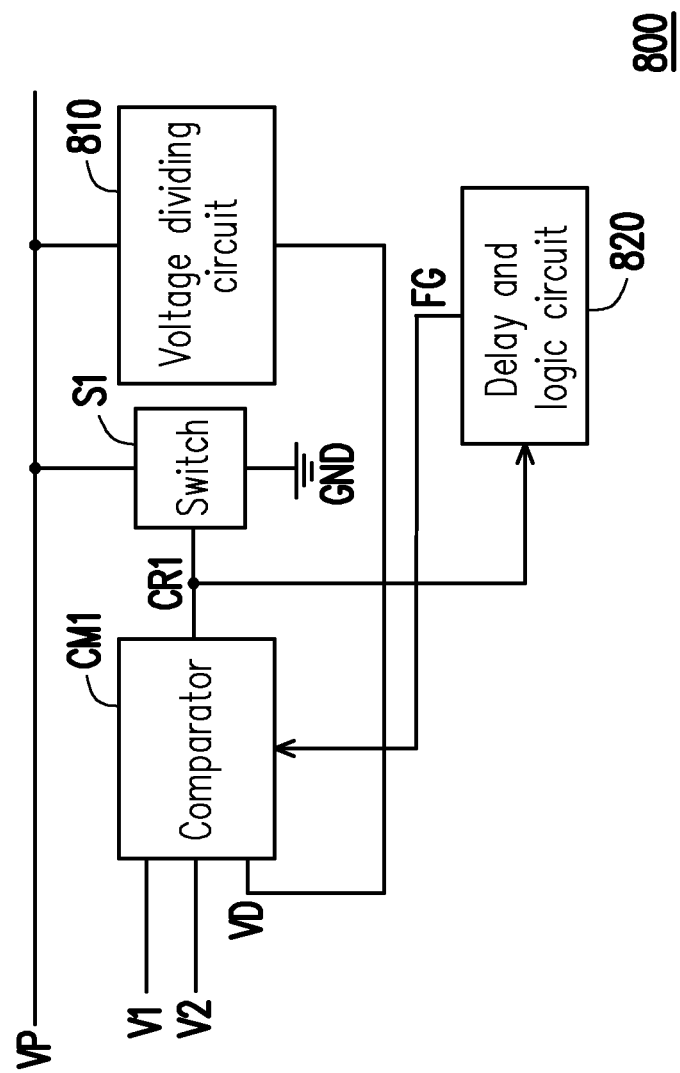
FIG. 8 is a schematic diagram of a protection circuit according to another embodiment of the disclosure.

Referring to FIG. 8 below, FIG. 8 is a schematic diagram of a protection circuit according to another embodiment of the disclosure. The protection circuit 800 includes a voltage dividing circuit 810, a delay and logic circuit 820, a comparator CM1 and a switch S1. In the embodiment, the comparator CM1 receives thresholds V1 and V2, and receives a divided voltage VD generated by the voltage dividing circuit 810, where the threshold V1 is greater than the threshold V2. In the embodiment, the voltage dividing circuit 810 includes, for example, a plurality of resistors connected in series. The voltage dividing circuit 810 receives the power voltage VP, and divides the power voltage VP to generate the divided voltage VD. The comparator CM1 may compare the divided voltage VD with the thresholds V1 and V2 to determine a state of the power voltage VP. Where, when the divided voltage VD is greater than the threshold V1, it is a first state; when the divided voltage VD is less than or equal to the threshold V1, and greater than the threshold V2, it is a second state; when the divided voltage VD is less than or equal to the threshold V1, and the divided voltage VD is greater than the threshold V2, and after a delay time counted by the delay and logic circuit 820, it is a third state; and when the divided voltage VD is less than or equal to the threshold V2, it is a fourth state. Where, the operation of the delay and logic circuit 820 is similar to that of the delay and logic circuit 120 or the delay and logic circuit 420 of the aforementioned embodiments.

In the first state and the second state, the switch S1 may be turned on according to the comparison result CR1 provided by the comparator CM1, so that part of current of the power voltage VP is conducted to the reference voltage terminal GND (for example, ground terminal). In the third state and the fourth state, the delay and logic circuit 820 may provide the indication signal FG to stop the operation of the comparator CM1. At the same time, the comparator CM1 stops providing the comparison result CR1 that may turn on the switch S1, and makes the switch S1 in a turn-off state.

In the embodiment, the thresholds V1 and V2 may also be provided by a band gap voltage generating circuit.

In summary, the protection circuit and protection method of the disclosure automatically detect multiple possible states of the harmonics of the power voltage by dividing the power voltage and comparing the divided voltage generated by the voltage dividing circuit with the reference voltage. The protection circuit of the disclosure may determine whether to turn on the switch coupled to the power voltage and the reference ground terminal according to different states of the harmonics of the power voltage. By turning on the above-mentioned switch to discharge part of current of the power voltage, a rising trend of the harmonics of the power voltage may be suppressed, thereby reducing the risk of damage to components in the circuit. In addition, the protection circuit of the disclosure may be implemented in integration and integrated in a chip, thereby reducing the number of additional external circuit components, and reducing a device area. Furthermore, the protection circuit and the protection method of the disclosure facilitate setting and adjustment of a judging mechanism through a programmable operation mode, which avails applications in various power supply fields.

What is claimed is:

1. A protection circuit, comprising:
   a voltage dividing circuit, configured to generate a first divided voltage and a second divided voltage based on a power voltage;
   a first comparator, coupled to the voltage dividing circuit, and configured to compare a reference voltage and the first divided voltage to generate a first comparison result;
   a first switch, coupled to the first comparator;
   a second comparator, coupled to the voltage dividing circuit, and configured to compare the reference voltage and the second divided voltage to generate a second comparison result; and a delay and logic circuit, coupled to the first comparator and the second comparator, and configured to receive the first comparison result and the second comparison result, wherein, when a first state or a second state occurs, the first switch is turned on to conduct part of current of the power voltage to a reference voltage terminal, wherein the first state is: the first divided voltage being greater than the reference voltage;

the second state is: the first divided voltage being less than or equal to the reference voltage, and the second divided voltage being greater than the reference voltage;

and when a third state or a fourth state occurs, the first switch changes from turn-on to turn-off, wherein the third state is: the first divided voltage being less than or equal to the reference voltage, and the second divided voltage being greater than the reference voltage and after a delay time counted by the delay and logic circuit;

the fourth state is: the first divided voltage being less than or equal to the reference voltage, and the second divided voltage being less than or equal to the reference voltage.

2. The protection circuit as claimed in claim 1, wherein when the third state or the fourth state occurs, the first comparator stops operating.

3. The protection circuit as claimed in claim 2, wherein when the third state or the fourth state occurs, the second comparator maintains operating.

4. The protection circuit as claimed in claim 3, wherein when the first comparator stops operating and the second comparator detects that the second divided voltage is greater than the reference voltage, the first comparator is reactivated so that the first switch changes from turn-off to turn-on.

5. The protection circuit as claimed in claim 1, wherein the voltage dividing circuit comprises:
   a first sub-voltage dividing circuit, coupled to the first comparator, and configured to generate the first divided voltage; and
   a second sub-voltage dividing circuit, coupled to the second comparator, and configured to generate the second divided voltage,
   wherein the first divided voltage is smaller than the second divided voltage.

6. The protection circuit as claimed in claim 5, further comprising:
   a second switch, coupled between the reference voltage terminal and the first sub-voltage dividing circuit, and coupled to the delay and logic circuit, wherein when the third state or the fourth state occurs, the second switch changes from turn-on to turn-off.

7. The protection circuit as claimed in claim 6, wherein when the first comparator stops operating and the second comparator detects that the second divided voltage is greater than the reference voltage, the second switch changes from turn-off to turn-on.

8. The protection circuit as claimed in claim 5, wherein the first sub-voltage dividing circuit comprises a first resistor and a second resistor connected in series, and the second sub-voltage dividing circuit comprises a third resistor and a fourth resistor connected in series.

9. The protection circuit as claimed in claim 1, wherein the voltage dividing circuit comprises a fifth resistor, a sixth resistor, and a seventh resistor connected in series, the first divided voltage is generated at a first node between the fifth resistor and the sixth resistor, and the second divided voltage is generated at a second node between the sixth resistor and the seventh resistor.

10. The protection circuit as claimed in claim 9, further comprising a third switch and a fourth switch,
    wherein, the third switch is coupled between the first node and the first comparator, a first terminal of the fourth switch is coupled between the third switch and the first comparator, and a second terminal of the fourth switch is coupled between the voltage dividing circuit and the reference voltage terminal.

11. The protection circuit as claimed in claim 10, wherein when the first state or the second state occurs, the third switch is turned on, and when the third state or the fourth state occurs, the third switch changes from turn-on to turn-off.

12. The protection circuit as claimed in claim 10, wherein when the first state or the second state occurs, the fourth switch is turned off, and when the third state or the fourth state occurs, the fourth switch changes from turn-off to turn-on.

13. The protection circuit as claimed in claim 1, wherein the delay time is determined based on a resonant waveform generated by the power voltage.

14. The protection circuit as claimed in claim 1, wherein when the power voltage is greater than a first threshold, the first divided voltage is greater than the reference voltage; when the power voltage is less than or equal to the first threshold and greater than a second threshold, the first divided voltage is less than or equal to the reference voltage, and the second divided voltage is greater than the reference voltage; and when the power voltage is less than or equal to the second threshold, the second divided voltage is less than or equal to the reference voltage, wherein the first threshold is greater than the second threshold.

15. The protection circuit as claimed in claim 1, further comprising a reference voltage generating circuit, configured to receive the power voltage to generate the reference voltage.

16. A protection method, comprising:
    providing a reference voltage;
    generating a first divided voltage and a second divided voltage based on a power voltage;
    respectively comparing the reference voltage with the first divided voltage and the second divided voltage to respectively generate a first comparison result and a second comparison result;
    when a first state or a second state occurs, conducting part of current of the power voltage to a reference voltage terminal; wherein
      the first state is: the first divided voltage being greater than the reference voltage;
      the second state is: the first divided voltage being less than or equal to the reference voltage, and the second divided voltage being greater than the reference voltage; and
    when a third state or a fourth state occurs, stopping conducting part of current to the reference voltage terminal, wherein
      the third state is: the first divided voltage being less than or equal to the reference voltage, and the second divided voltage being greater than the reference voltage and after a delay time counted by a delay and logic circuit;

the fourth state is: the first divided voltage being less than or equal to the reference voltage, and the second divided voltage being less than or equal to the reference voltage.

17. The protection method as claimed in claim 16, further comprising:
when the third state or the fourth state occurs, stopping comparing the reference voltage and the first divided voltage, and keeping comparing the reference voltage and the second divided voltage.

18. The protection method as claimed in claim 17, wherein when the comparison between the reference voltage and the first divided voltage stops and the second divided voltage is greater than the reference voltage again, part of current is conducted to the reference voltage terminal again.

19. The protection method as claimed in claim 18, wherein when the third state or the fourth state occurs, a voltage value of the first divided voltage is equal to a voltage value of the power voltage.

20. A protection circuit, comprising:
a voltage dividing circuit, configured to generate a divided voltage based on a power voltage;
a comparator, coupled to the voltage dividing circuit, and configured to compare the divided voltage with a first reference voltage and a second reference voltage to generate a comparison result, wherein the first reference voltage is greater than the second reference voltage;
a switch, coupled to the comparator; and
a delay and logic circuit, coupled to the comparator, and configured to receive the comparison result;
wherein when a first state or a second state occurs, the switch is turned on to conduct part of current of the power voltage to a reference voltage terminal, wherein
the first state is: the divided voltage being greater than the first reference voltage;
the second state is: the divided voltage being less than or equal to the first reference voltage, and the divided voltage being greater than the second reference voltage;
and when a third state or a fourth state occurs, the switch changes from turn-on to turn-off, wherein
the third state is: the divided voltage being less than or equal to the first reference voltage, and the divided voltage being greater than the second reference voltage, and after a delay time counted by the delay and logic circuit;
the fourth state is: the divided voltage being less than or equal to the second reference voltage.

* * * * *